United States Patent [19]

Tabata et al.

[11] Patent Number: 5,191,798
[45] Date of Patent: Mar. 9, 1993

[54] PRESSURE SENSOR

[75] Inventors: Aki Tabata, Isehara; Jun Tajika; Hiroshi Inagaki, both of Hiratsuka; Yukio Kobayashi, Isehara; Noritake Suzuki, Hiratsuka, all of Japan

[73] Assignee: Kabushiki Kaisha Komatsu Seisakusho, Tokyo, Japan

[21] Appl. No.: 490,565
[22] PCT Filed: Sep. 7, 1989
[86] PCT No.: PCT/JP89/00923
    § 371 Date: Jun. 10, 1991
    § 102(e) Date: Jun. 10, 1991
[87] PCT Pub. No.: WO90/03664
    PCT Pub. Date: Apr. 5, 1990

[30] Foreign Application Priority Data

Sep. 30, 1988 [JP] Japan .................. 63-247073

[51] Int. Cl.⁵ .................. G01L 7/08; G01L 9/06
[52] U.S. Cl. .................. 73/727; 73/708; 73/721; 338/4; 338/42
[58] Field of Search .................. 73/706, 708, 721, 720, 73/726, 727, 753, 754, 756, DIG. 4; 338/4

[56] References Cited

U.S. PATENT DOCUMENTS

| | | | |
|---|---|---|---|
| 4,129,042 | 12/1978 | Rosvold | 73/727 |
| 4,939,497 | 7/1990 | Nishida et al. | 73/721 |
| 4,984,468 | 1/1991 | Hafner | 73/727 |
| 5,001,934 | 3/1991 | Tucker | 73/721 |

FOREIGN PATENT DOCUMENTS

| | | |
|---|---|---|
| 53-22385 | 3/1978 | Japan . |
| 53-99785 | 8/1978 | Japan . |
| 54-78991 | 6/1979 | Japan . |
| 55-124271 | 9/1980 | Japan . |
| 56-43771 | 4/1981 | Japan . |
| 57-68080 | 4/1982 | Japan . |
| 57-173718 | 10/1982 | Japan . |
| 58-44303 | 3/1983 | Japan . |
| 58-139475 | 8/1983 | Japan . |
| 59-217374 | 12/1984 | Japan . |
| 61-163667 | 7/1986 | Japan . |
| 61-213741 | 9/1986 | Japan . |
| 62-18072 | 1/1987 | Japan . |

OTHER PUBLICATIONS

Haag et al, "Development of a Sputtered Thin Film Pressure Transducer for Use over the Temperature Range of −320° to 500° F.", Advances in Instrumentation, vol. 32, No. 2, pp. 145-162, Pittsburgh, U.S.A., 1977.

Soviet Inventions Illustrated, Week 8722, Derwent Publications Ltd., London, England, for SU (A) 1264-015 (Zakharov K.V.), Oct. 15, 1986.

Ishihara et al, "CMOS Integrated Silicon Pressure Sensor", IEEE Journal of Solid-State Circuits, vol. sc-22, No. 2, Apr. 1987, pp. 151-156.

International Publication No. WO89/03592, Apr. 20, 1989.

Primary Examiner—Donald O. Woodiel
Attorney, Agent, or Firm—Richards, Medlock & Andrews

[57] ABSTRACT

A pressure sensor including a semiconductor strain gauge and resistors for compensating temperature, a zero point or the like and made of the same material as that of said semiconductor strain gauge are formed on a metal diaphragm thereof. The resistors for the compensating circuit and the strain gauge are simultaneously formed by patterning a polycrystalline silicone thin film or the like laminated on the diaphragm. As a result, the number of the elements and the manufacturing processes such as a soldering process are reduced for the purpose of improving manufacturing yield. In order to widen the zero point compensating range, a plurality of zero-point compensating resistors, if formed, are disposed on a circumference relative to the center of the diaphragm so as to reduced the scattering in the level of the resistance of each of the resistors. On the other hand, a stepped portion is formed between the holding surface of the diaphragm and the pressure receiving surface of the same so that the pressure receiving portion does not receive a bad influence even if the holding position on the holding surface is deviated due to the pressure applied to the diaphragm. As a result, the linearity of the output characteristics can be improved.

20 Claims, 10 Drawing Sheets

PRESSURE SENSOR

FIELD OF THE INVENTION

The present invention relates to a pressure sensor using a strain gauge, and, more particularly, to a thin film pressure sensor constituted in such a manner that a diaphragm is made of a metal such as stainless steel and a strain gauge made of a semiconductor thin film such as silicone thin film or the like is formed on the diaphragm via an insulating film.

BACKGROUND OF THE INVENTION

There has been a variety of sensors in which a semiconductor strain gauge is employed, the semiconductor strain gauge utilizing a piezo electric effect characterized in that a large resistance change is displayed when strain is applied to a semiconductor. For example, there has been a thin film pressure sensor constituted in such a manner that a diaphragm is made of a metal such as stainless steel and a strain gauge made of a semiconductor thin film such as silicone thin film or the like is formed on the diaphragm via an insulating film.

As shown in FIG. 1A which is a cross sectional view, the thin film pressure sensor is structured in such a manner that a sensor portion 5 is, via a silicon oxide ($SiO_2$) film 2 serving as an insulating film, formed on the surface of a diaphragm 1 made of stainless steel. The sensor portion 5 comprises: a strain gauge 3 constituted by polycrystalline silicone layer patterns formed on the $SiO_2$ film 2; and an electrode 4 constituted by aluminum layer patterns and for supplying power to the strain gauge 3, the sensor portion 5 being covered with a passivation film 6 made of a silicone nitride layer. As shown in FIG. 1B, the sensor portion 5 is constituted by four patterns R1 to R4 forming the strain gauge 3 and six circuit patterns E1 to E6 for forming the electrode 4, the electrode 4 serving to supply power to the strain gauge 3. As shown in FIG. 1C, the sensor portion 5 forms a bridge circuit when it is expressed as an equivalent circuit so that the pressure can be measured by detecting the change in voltage between the electrode circuit patterns E2 and E5 due to the change in the level of the resistance of the strain gauge 3 when pressure is applied to the thin film pressure sensor.

However, the semiconductor has a disadvantage in that its characteristics excessively depend upon temperature. However, it has an excellent repetitive reproductionality against temperature. The characteristics of this type raise the reliability of the device after the compensation has been performed.

In the case of a semiconductor thin film pressure sensor, the resistance of the strain gauge changes in accordance with temperature as well as in accordance with the specific resistance of the strain gauge and the resistance change due to pressure. Therefore, both the pressure sensitivity and the zero point in a bridge circuit formed by combining strain gauges are inevitably changed. Since accuracy of the pressure sensor depends upon the way of performing the temperature compensation, a variety of methods have been attempted.

FIG. 2 illustrates an equivalent circuit acting in accordance with a method of compensating the temperature change of the strain gauge by using a temperature compensating circuit with a pressure sensor arranged to be operated by a rated voltage, the temperature compensating circuit being formed by combining a transistor and resistors.

The temperature compensating circuit 7 comprises an NPN-type transistor Tr and resistors R5 and R6 connected between the emitter of the transistor Tr and the base of the same and between the collector of the transistor Tr and the base of the same, the emitter of the transistor Tr being connected to the contact between electrode circuit patterns E4 and E6. The collector of the transistor Tr is connected to the positive side of a power supply source Vin via a circuit pattern E8 (omitted from FIG. 1).

The temperature compensating circuit 7 of the type described above is, as shown in FIG. 3, disposed outside the thin pressure sensor. That is, a thin film pressure sensor 100 is included in a case 101, and is included, together with the case 101, in a case 102 for an external circuit. The case 102 accommodates a printed board 104 to which an amplifier 105 and a temperature-compensating device 6 constituting the temperature compensating circuit 7 are connected. The accommodating portion accommodating the printed board 104 is closed by a cover 103. The output from the thin film pressure sensor 100 is temperature compensated by a temperature-compensating device 106 on the printed board 104, and is amplified by the amplifier 105 before being transmitted to an external circuit (omitted from illustration).

The sensitivity of the thin film pressure sensor 100 is, as designated by a line 1 of FIG. 4A, linearly lowered in accordance with the rising of the temperature, where the term "sensitivity" means the rate of change between the level of the pressure received by the pressure sensor 100 and the resistance caused from the pressure, that is, the following relationship is held:

$$\text{Sensitivity} = \frac{\Delta(\text{resistance})}{\Delta(\text{pressure})}$$

As is shown from this, the more the sensitivity rises, the more the accuracy improves.

On the other hand, the potential drop across the transistor Tr for compensating the temperature becomes smaller in accordance with the rising of the temperature. Therefore, the voltage applied to the sensor portion 5 via the transistor Tr is, as designated by a line m of FIG. 4B, raised if the supplied voltage is made constant. Therefore, in a pressure sensor of a type having the above-described temperature-compensating circuit 7, the degree of deterioration in the sensitivity of the sensor portion due to the temperature rise is compensated by the rising of the voltage applied to the sensor portion 5. As a result, even if temperature has been raised, constant sensitivity level can be maintained as designated by a line n of FIG. 4A. As described above, the thin film pressure sensor 100 including the temperature compensating device 106 exhibits an excellent reliability since its sensitivity is not changed due to temperature.

In a pressure sensor having the above-described temperature compensating circuit 7, the rate of change in the potential drop of the transistor Tr, which is being used, due to temperature and the rate of change in sensitivity deterioration of the strain gauge 3 due to temperature do not always coincide with each other. However, since the temperature-dependency of the potential drop of the transistor Tr can be freely varied by changing the resistance ratio of the two resistor devices R5 and R6 connected to the transistor Tr, the resistance ratio of the resistor devices R5 and R6 is changed so as to coincide the change rate of the potential drop of the transistor Tr with the change rate of the sensitivity deterioration of the strain gauge 3. Thus, the sensitivity compensation of the thin film pressure sensor 100 against temperature is accurately performed.

On the other hand, in order to compensate the zero point against the dispersion between the strain gauges, a method has been employed in which a resistor is inserted in series with any side of the bride circuit, that is any of the patterns R1 to R4 of the strain gauge 3. In Japanese Patent Laid Open No. 53-22385, a technology has been disclosed in which a semiconductor gauge resistor is formed by diffusing impurities in a portion which is deformed by the pressure of a diaphragm type silicone mono-crystal and which thereby generates strain. Furthermore, a zero-point compensating semiconductor resistor is formed in a portion which is not deformed by the pressure of the silicone mono-crystal by diffusing impurities of the same density as that of the semiconductor gauge resistor. The thus formed gauge resistor and the zero-point compensating semiconductor resistor are connected to each other by an aluminum electrode.

However, even if the zero-point compensating resistor is formed by a semiconductor, the resistors R5 and R6 of the temperature compensating circuit 7 for compensating the sensitivity must be soldered to the printed board 104 together with the transistor Tr. Hitherto, the transistor Tr and the two resistor devices have been soldered to the printed board 104 or the electrode of the pressure sensor has been connected to the printed board 104. Since above—described elements are very small in size, the above-described connections have been very difficult to establish. In particular, since the conventional thin film pressure sensor has been manufactured by soldering the two resistor devices to the printed board 104 thereof, the number of elements and the manufacturing processes increase inevitably. As a result, a factor deteriorating the manufacturing efficiency and a factor deteriorating the yield due to the defective elements or imperfect contact of elements are excessively increased.

Hitherto, a sensor module consisting of the diaphragm and the sensor portion 5 is assembled to a pressure transducer or the other devices to be measured, a holding surface 1a (holding position Q) at which the sensor module is held and a pressure receiving surface ib are positioned at substantially the same surface (see FIG. 5). Therefore, when pressure is applied to the pressure receiving surface 1b of the conventional thin film pressure sensor 100, the holding surface 2 is deformed, causing the holding position to be deviated. As a result, the pressure receiving portion receives a bad influence. That is, in the conventional thin film pressure sensor 100, when the holding position on the holding surface 1a is radially shifted as q1, q2, q3 and q4 as shown in FIG. 5, the distribution of stress or on the surface of the diaphragm changes considerably as shown in the upper portion of FIG. 5. Therefore, when the holding position, which has been at a position shown in FIG. 6A when no pressure had been applied, is shifted to the periphery portion as shown in FIG. 6B due to the deformation of the diaphragm 1 and a holding member 110 by the pressure applied, the stress distribution in the pressure receiving portion of the diaphragm 1 is changed. As a result, a problem arises in that the linearity of the output characteristics of the pressure sensor with respect to the pressure receives a bad influence, and the accuracy is thereby deteriorated.

SUMMARY OF THE INVENTION

Accordingly, an object of the present invention is to provide a pressure sensor which can be manufactured by a reduced number of components and manufacturing processes with an excellent yield maintained.

A second object of the present invention is to provide a pressure sensor in which the scattering in the level of resistances of the resistors can be reduced when a plurality of resistors are provided for a resistor circuit for compensating the zero point. A further object of the present invention is to provide a pressure sensor in which the change in the stress distribution on the diaphragm can be prevented and the linearity of the output characteristics thereof can thereby be improved.

In order to achieve the above-described objects, a first aspect of the present invention lies in a thin film pressure sensor having a strain gauge on the reverse side to a pressure receiving side of a diaphragm thereof via an insulating film, the thin film pressure sensor comprising: a resistor circuit made of the same material as that of the strain gauge and for compensating temperature, zero point or the like, the resistor circuit being disposed on the surface on which the strain gauge is formed.

That is, the resistors for compensating the temperature, the zero point or the like of the thin film pressure sensor is made of a material which forms the strain gauge of the thin film pressure sensor as an alternative to the resistor device. That is, the thin film pressure sensor according to the present invention is manufactured by laminating semiconductor thin films such as a polycrystalline silicone thin film on the pressure receiving portion of a diaphragm thereof, the thus laminated thin films are subjected to a patterning for the purpose of forming the strain gauge. Therefore, the resistors can be formed by a patterning performed simultaneously with the forming of the strain gauge. Furthermore, the sensor portion of the strain gauge and the resistor are connected to each other with the same material as that of the electrode circuit pattern in the sensor portion and simultaneously with the forming of the electrode circuit pattern.

According to the thus formed resistor portion made of polycrystalline silicone thin film or the like, a desired resistance level can be obtained by changing its shape. Therefore, the degree of the temperature dependency of the potential drop of the transistor can be made to coincide with the change rate of the sensitivity deterioration of the strain gauge by using the resistor made of the polycrystalline silicone thin film or the like as an alternative to the conventional resistor device. Therefore, the number of elements and the manufacturing processes can be reduced. As a result, a factor deteriorating the manufacturing efficiency and a factor deteriorating the yield due to the defective elements or imperfect contact of elements taken place in proportion to the increase in the number of the manufacturing processes can be eliminated. As a result, a satisfactory yield can be obtained.

Furthermore, according to the pressure sensor according to the present invention, the zero-point compensating circuit can be readily formed by forming the resistor for the zero-point compensation together with the resistor for the sensitivity compensation by a polycrystalline silicone thin film or the like which is the same material as that of the strain gauge by patterning conducted simultaneously with the patterning of the strain gauge. Furthermore, a plurality of resistors for the zero-point compensation can be formed for the purpose of widening the compensating range. In the case where a plurality of the zero-point compensating resistors are formed, the resistors are arranged on the same circle relative to the center of the diaphragm so that the influence of the film thickness distribution taken place when the pressure sensitive layer between the resistors is formed is ignored. Thus, the scattering in the level of the resistance of each of the resistors can be reduced and an accurate compensation can thereby be enabled.

The strain gauge can be formed in a zigzag pattern so as to raise the resistance level thereof If the resistance level of the strain gauge can be raised, the resistance level of the zero-point compensating resistor can also be raised. As a result, the structure can be formed simply.

A second aspect of the present invention lies in a pressure sensor of a thin film pressure sensor type having a strain gauge on the reverse side to a pressure receiving side of a diaphragm thereof via an insulating film, the thin film pressure sensor comprising: a stepped portion formed between the surface of the diaphragm which is held and the surface of the diaphragm which receives pressure Therefore, according to the pressure sensor according to the second embodiment of the present invention, the holding surface and the pressure receiving surface are positioned at different positions so that the stress distribution in the pressure receiving sensor cannot be changed due to the shift of the holding position due to the pressure applied to the pressure sensor. Therefore, the linearity of the output characteristics can be improved.

Other and further objects, features and advantages of the invention will be appear more fully from the following description.

PREFERRED EMBODIMENTS OF THE INVENTION

Preferred embodiments of the present invention will now be described with reference to the drawings.

Figure 7A:
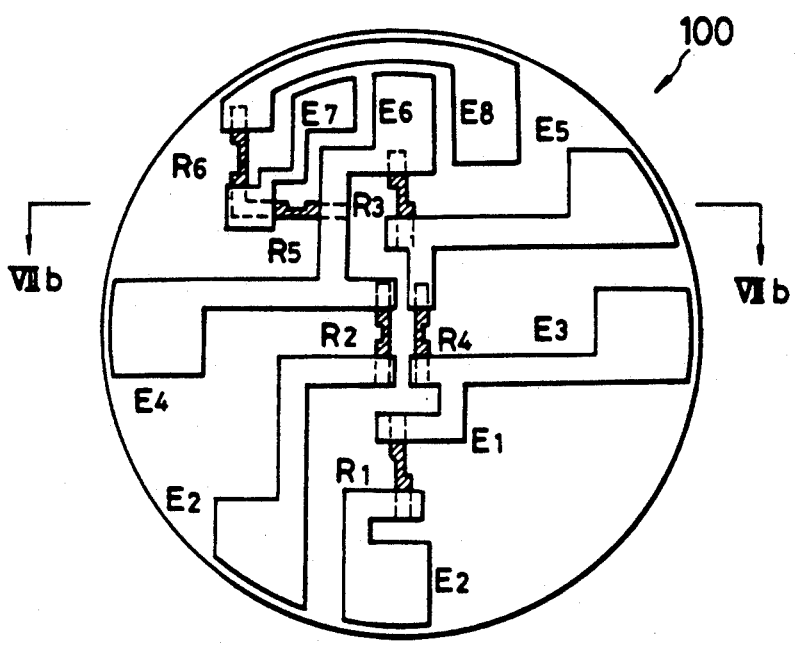
FIG. 7A is a plan view which illustrates a thin film pressure sensor according to a first embodiment of the present invention.
Figure 7B:
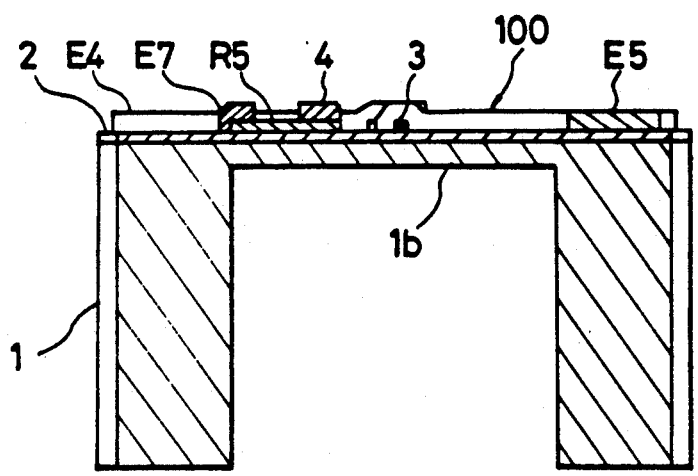
FIG. 7B is a cross sectional view taken along line VIIb—VIIb of FIG. 7A.

FIG. 7A is a plan view which illustrates a first embodiment of the present invention, FIG. 7B is a cross sectional view of the same. As shown in FIG. 7B, temperature compensating resistors R5 and R6 for sensitivity are formed on the surface of a diaphragm 1 on which a strain gauge 3 (patterns R1 to R4) is formed. As shown in FIG. 7A, the resistor R5 is disposed between a contact of electrode circuit patterns E4 and E6, and a circuit pattern E7, while the resistor R6 is disposed between a circuit pattern E8 to which the positive side of a power supply source Vin (omitted from illustration) is connected and the circuit pattern E7.

Figure 1B:
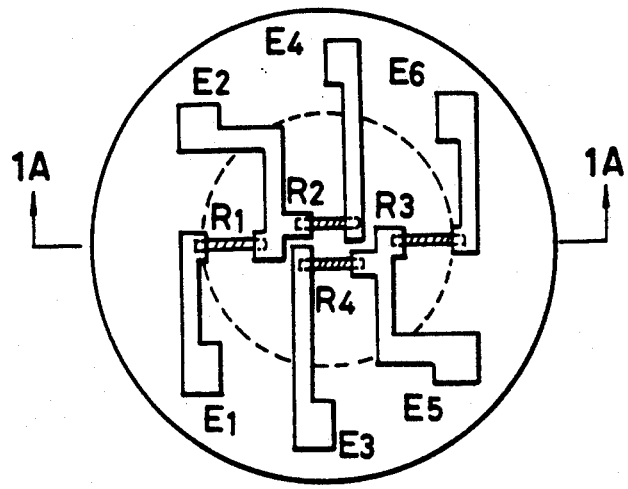
FIG. 1B is plan view which illustrates the conventional thin film pressure sensor.
Figure 1C:
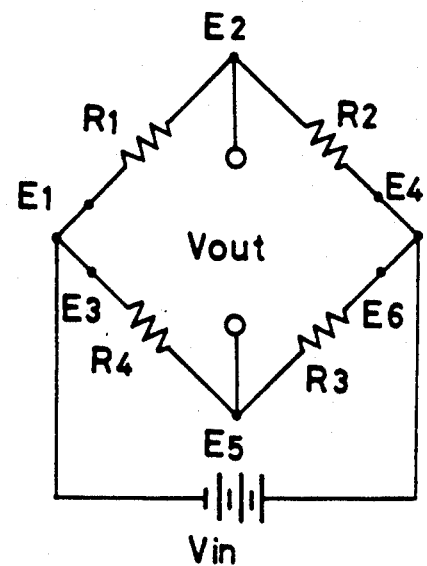
FIG. 1C illustrates an equivalent circuit of the conventional thin film pressure sensor.
Figure 1A:
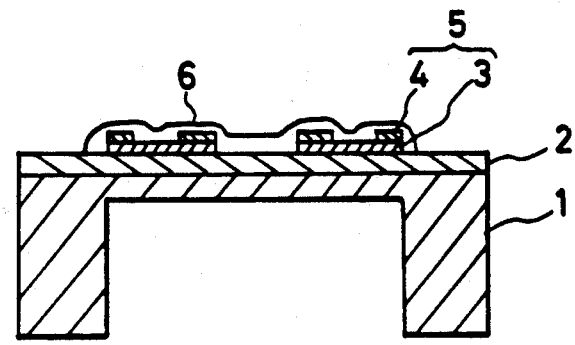
FIG. 1A is a cross sectional view which illustrates a conventional thin film pressure sensor and taken along line 1A—1A of FIG. 1B.
Figure 2:
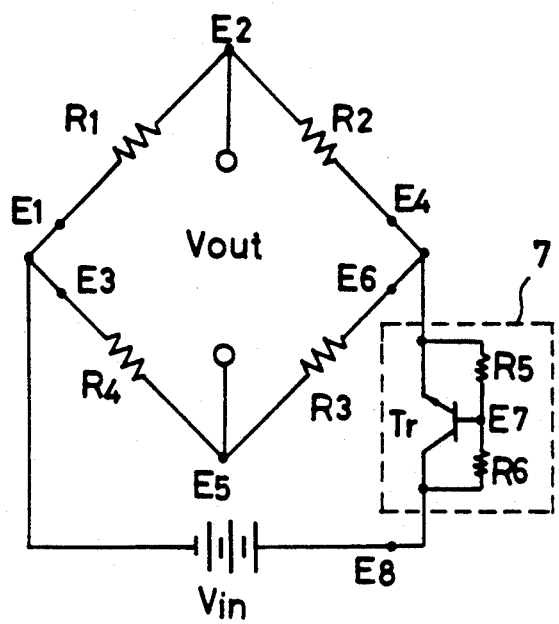
FIG. 2 illustrates an equivalent circuit of a pressure sensor in which a temperature-compensating circuit for sensitivity is provided therein.

As shown in FIG. 7B, a thin film pressure sensor according to this embodiment is arranged in such a manner that an $SiO_2$ film 2 serving as an insulating film is laminated to a pressure receiving portion of a diaphragm 1 made of stainless steel, that is on the reverse side of a pressure receiving surface 1b of the diaphragm 1. Furthermore, the patterns R1 to R4 of the strain gauge made of a polycrystalline silicone thin film and the resistors R5 and R6 are formed on the $SiO_2$ film 2 on which circuit patterns (E1 to E6) of the electrodes 4 are formed. A temperature compensating NPN-type transistors Tr (omitted from illustration) is, from outside, connected in such a manner that its emitter is connected between the circuit patterns E4 and E6, its base is connected to the circuit pattern E7 and its collector is connected to a circuit pattern E8, respectively. Therefore, the equivalent circuit of the thin film pressure sensor 100 is similar to that shown in FIG. 2.

Figure 8A:
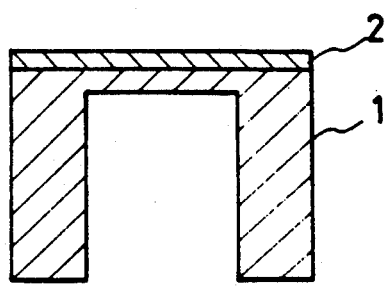
FIGS. 8(A)–8(E) illustrate five stages in the manufacturing process for manufacturing the pressure sensor according to the first embodiment of the present invention.
Figure 8D:
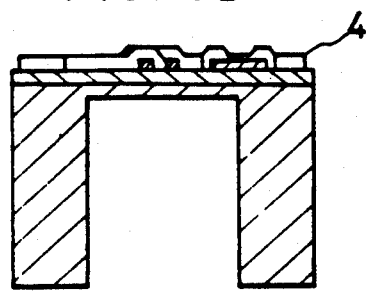
Figure 8B:
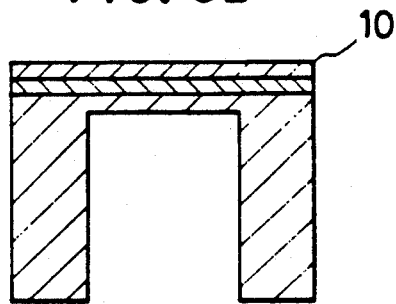
Figure 8E:
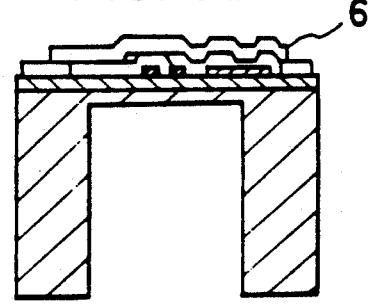
Figure 8C:
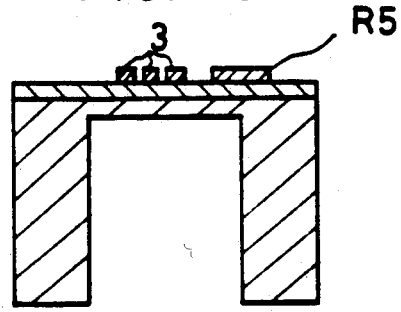

FIGS. 8A to 8E show the manufacturing process for obtaining the thin film pressure sensor according to the first embodiment of the present invention. (1) As shown in FIG. 8A, an about 7 μm $SiO_2$ film 2 serving as the insulating film is laminated on the stainless diaphragm 1 in accordance with the plasma CVD method. (2). As shown in FIG. 8B, an about 0.5 μm polycrystalline thin film 10 is laminated on the $SiO_2$ film 2 by using silane gas in accordance with the plasma CVD method. (3) As shown in FIG. 8C, the laminated polycrystalline silicone thin film 10 is arranged to be the patterns R1 to R4 of the strain gauges 3 and the resistor patterns R5 and R6 in accordance with the photolithography method. Since a desired resistance level of the resistors R5 and R6 can be obtained by changing their shapes at this time, the degree of the temperature dependency of the transistor Tr in the compensating circuit can be changed.

Since the resistance level of the thus-formed resistor patterns R5 and R6 is changed when strain is generated, they must be formed in the periphery of the diaphragm in which no strain is generated due to the applied pressure in order to maintain a predetermined value. (4) As shown in FIG. 8D, a metal electrode 4 made of aluminum (Al) or the like is evaporated on the formed strain gauges 3 (patterns R1 to R4), and the resistors R5 and R6 and circuit patterns E1 to E8 of the electrode 4 are formed and circuits are established by the photolithography method. (5) As shown in FIG. 8E, an SiNx film serving as a passivation film is laminated to the strain gauges 3, the resistors R5 and R6 and the circuit patterns E1 to E8 by about 5000Å in accordance with the plasma CVD method in order to protect the strain gauges 3, the resistors R5 and R 6 and the circuit patterns E1 to E8.

Figure 3:
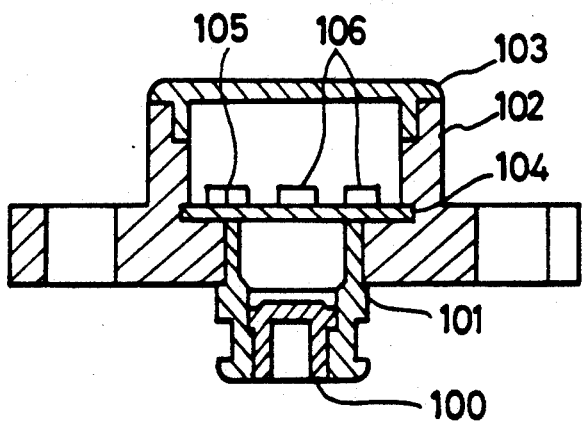
FIG. 3 is a cross-sectional view which illustrates a state in which the conventional thin film pressure sensor, the temperature-compensating circuit and the like are assembled in a case.
Figure 4A:
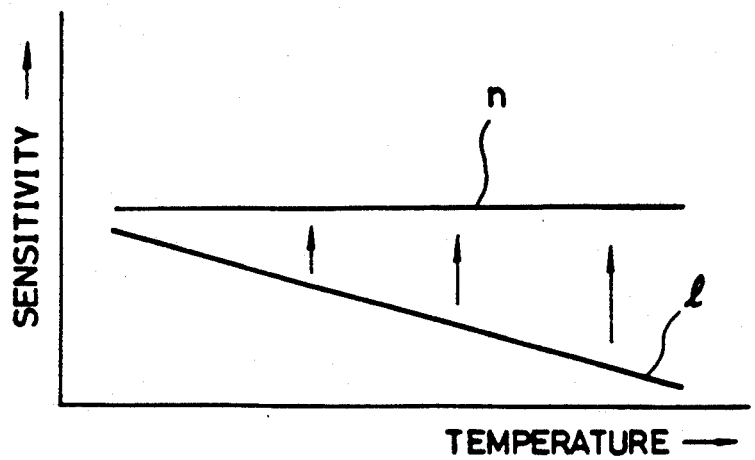
FIG. 4A illustrates the relationship between the sensitivity and temperature of the conventional thin film pressure sensor.
Figure 4B:
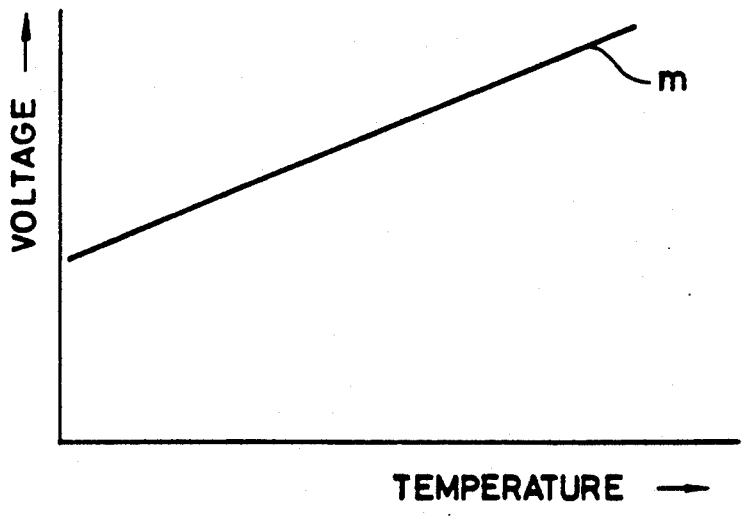
FIG. 4B illustrates the relationship between voltage applied, via the temperature compensating device, to a sensor portion and temperature.
Figure 5A:
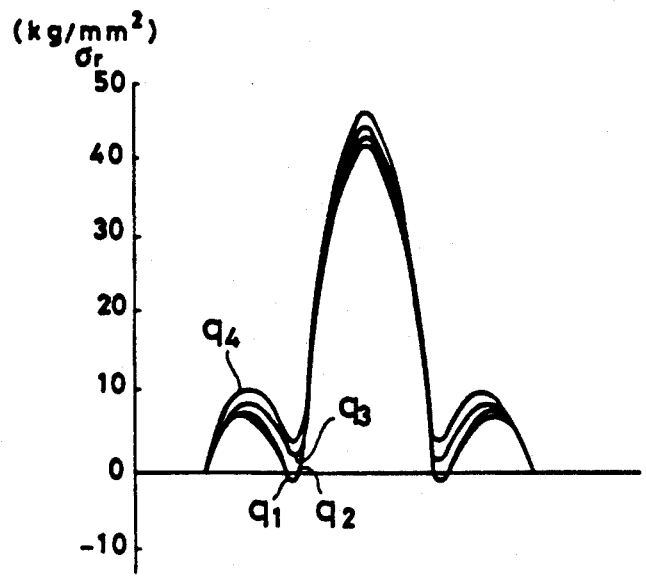
FIG. 5A illustrates the dependency of the stress distribution of a diaphragm of the conventional thin film pressure sensor upon the holding position.
Figure 5B:
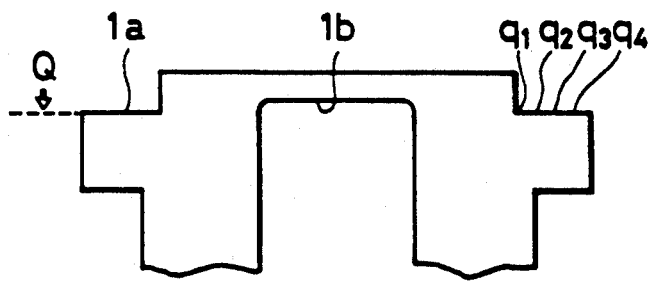
FIG. 5(B) illustrates the diaphragm of the conventional thin film pressure sensor corresponding to FIG. 5(A)

Thus, the thin film pressure sensor is completed. The thus completed thin film pressure sensor 100 is, similarly to that shown in FIG. 3, accommodated in a case 101, and is accommodated in a case 102 for the external circuit together with the case 101. The case 102 includes a printed board 104 to which an amplifier 105 and the temperature-compensating transistor Tr are connected, the accommodating portion of the printed board 104 being closed by a cover 103. The transistor Tr on the printed board 104 is connected in such a manner that its emitter is connected between the electrodes E7 and E8 of the thin film pressure sensor 100, its base is connected to E7 and its collector is connected to E8 by bonding wires. Thus, the temperature compensating circuit for sensitivity is completed, and output from the thin film pressure sensor 100 is amplified by the amplifier 105 so as to be transmitted to an external circuit (omitted from illustration) through the circuit patterns E2 and E5.

According to the thus structured thin film pressure sensor, when temperature compensating circuit for sensitivity is constituted, the temperature compensating resistor can be formed without necessity of increasing the number of elements and manufacturing processes. That is, since the resistors R5 and R6 for the temperature compensation are made of the same material as that of the strain gauge 3 and are formed on the diaphragm 1 by the same manufacturing process, the manufacturing process for the thin film pressure sensor can be maintained. That is, the forming of the resistors R5 and R6 does not cause the overall manufacturing time to be elongated. Furthermore, according to the thin film pressure sensor 100 according to this embodiment, the necessity of connecting the temperature compensating resistor device to the printed board 104 can be eliminated. Therefore, the number of the elements can be reduced and the manufacturing process such as the soldering process can be eliminated. As a result, a factor deteriorating the manufacturing efficiency and a factor deteriorating the yield due to the defective elements or imperfect contact of elements taken place in proportion to the increase in the number of the manufacturing processes can be eliminated. As a result, a satisfactory yield can be obtained.

Figure 9A:
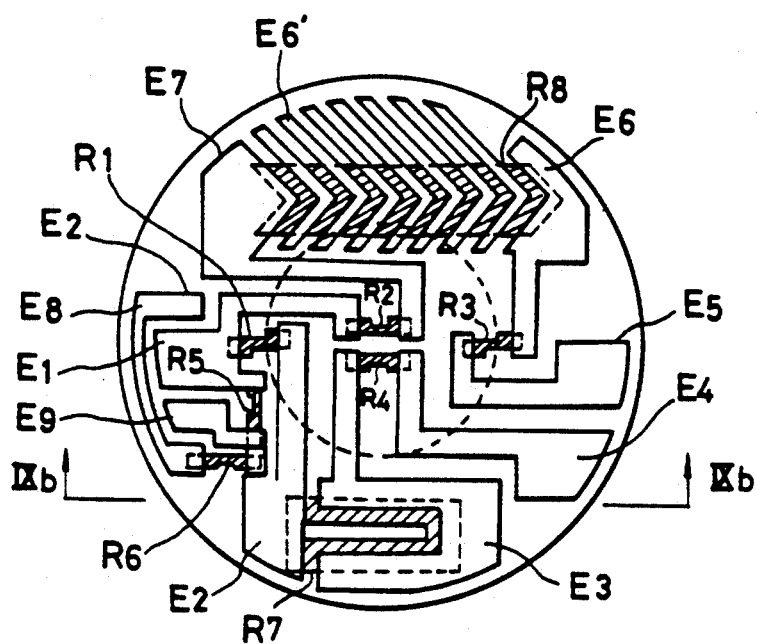
FIG. 9A is a plan view which illustrates the thin film pressure sensor according to a second embodiment of the present invention.
Figure 9B:
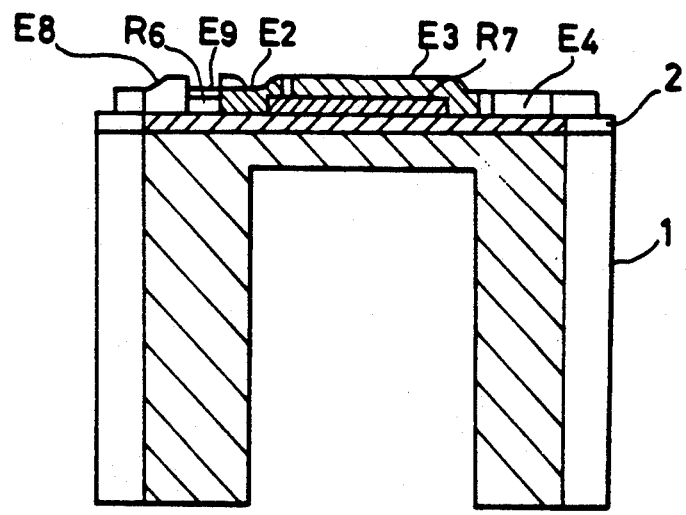
FIG. 9B is a cross sectional view taken along line IXb—IXb of FIG. 9A.

Although the description has been made upon the circuit for compensating sensitivity against temperature, the present invention is not limited to this description. For example, it can be applied to a circuit for compensating temperature influence upon the zero point, and to a circuit for compensating the zero point due to the dispersion between strain gauges. Second Embodiment FIG. 9A is a plan view which illustrates a second embodiment arranged in such a manner that the temperature compensating circuit resistor for sensitivity and the zero-point compensating resistors against scattering taken place between strain gauges are formed on the diaphragm of the thin film pressure sensor. FIG. 9B is a cross sectional view of the same.

The patterns R1 to R4 of the strain gauge 3 are disposed as shown in FIG. 9A in such a manner that the pattern R1 is connected to the circuit patterns E1 and E2, the pattern R2 is connected to the circuit patterns E1 and E2, the pattern R3 is connected to the circuit patterns E5 and E6, and the pattern R4 is connected to the circuit patterns E3 and E4. A zero-point fine adjustment resistor R7 is formed between the circuit patterns E2 and E3. A zero-point coarse adjustment resistor R8 is formed between the circuit patterns E6 and E7. The coarse resistor R8 is divided into a plurality of sections by a circuit pattern E6' for the purpose of widening the compensating range. The temperature compensating resistor R5 for sensitivity is connected between the circuit pattern E1 and a circuit pattern E9 to which the case of the transistor Tr is connected, and the resistor R6 is connected between the circuit pattern E9 and the circuit pattern E8.

The patterns R1 to R4 and the resistors R5, R6, R7 and R8 are formed by a patterning in accordance with a photolithography method after the polycrystalline silicone thin film has been laminated to the $SiO_2$ film 2 serving as the insulating film and formed on the diaphragm 1. According to the thin film pressure sensor according to this embodiment, metal such as Al is, after the above-described pattern has been formed, laminated to the strain gauges and the resistors so as to be subjected to the patterning so that the electrode circuits E1 to E8 are formed. Then, a passivation film (omitted from illustration) is laminated, and thus the thin film pressure sensor is completed.

Figure 9C:
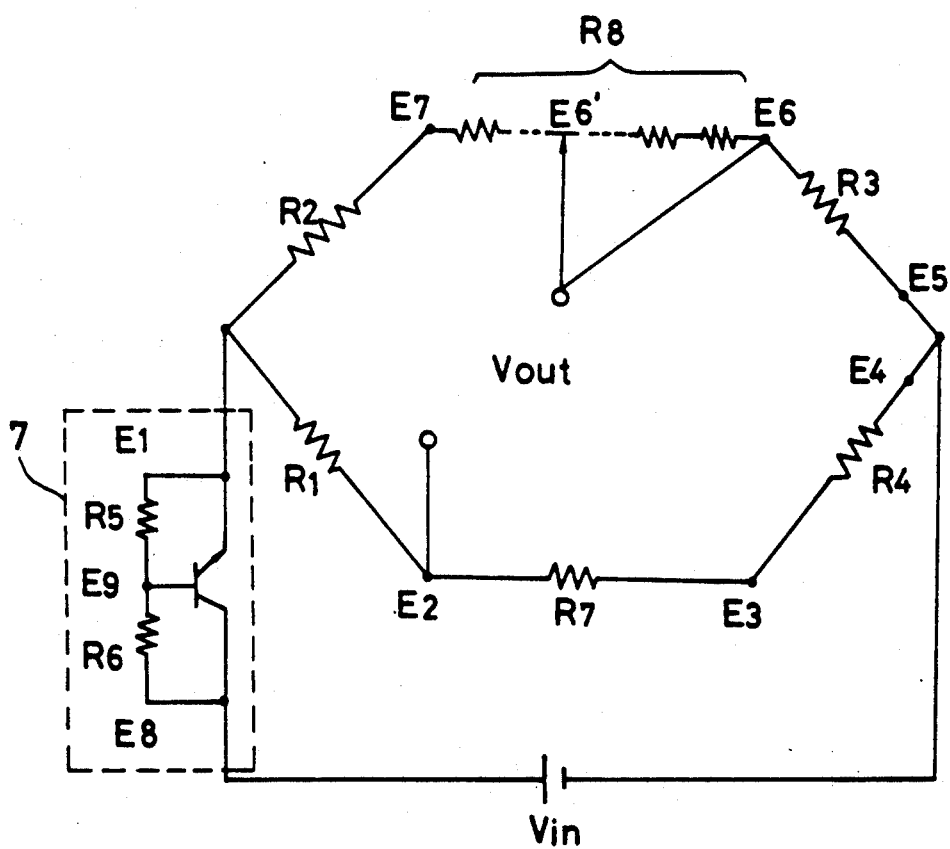
FIG. 9C illustrates an equivalent circuit according to the second embodiment.

In order to form an equivalent circuit shown in FIG. 9C of the thus formed thin film pressure sensor, the circuit patterns E4 and E5 are connected to each other so that a bridge circuit is formed. Furthermore, the circuit pattern E6 and an optional circuit pattern E6' are connected to each other and the thus obtained contact and the circuit pattern E2 are arranged to be the output electrodes.

Figure 10A:
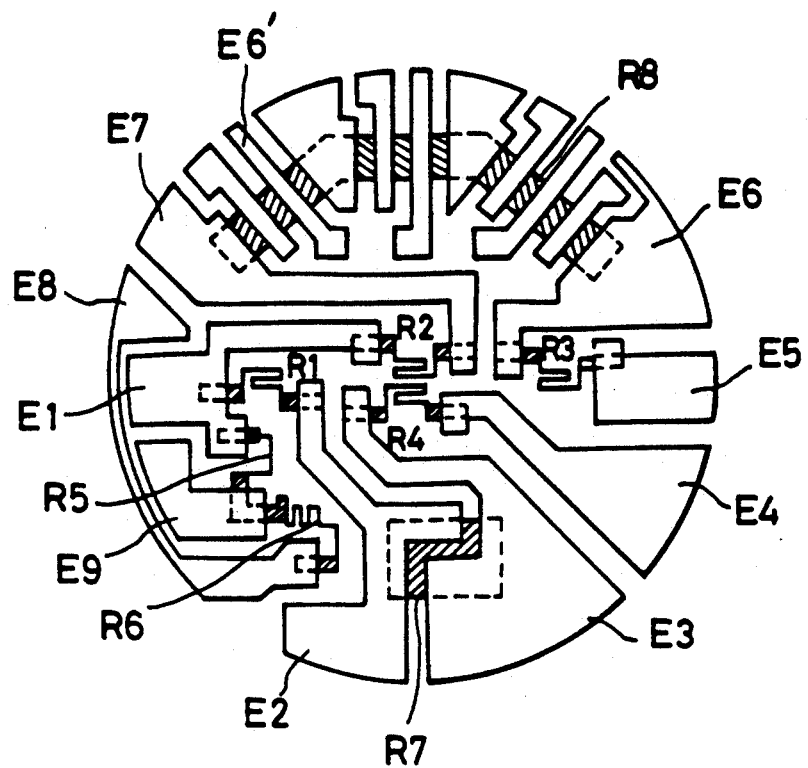
FIG. 10A is a plan view which illustrates the thin film pressure sensor according to a third embodiment of the present invention.
Figure 10B:
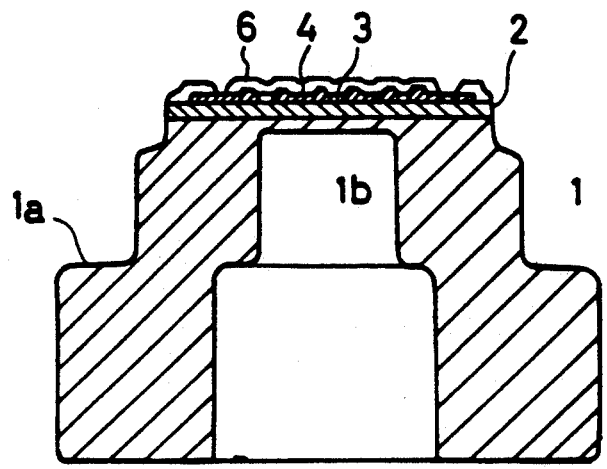
FIG. 10B is a cross sectional view which illustrates the thin film pressure sensor according to the third embodiment of the present invention.

According to the thus-formed thin film pressure sensor, the connection of the second electrode pattern of the circuit pattern E6' when counted from the left end in FIG. 9A and the circuit pattern E6 are connected to each other means that two zero-point compensating coarse adjustment resistors R8 are added to the pattern R2 and one zero-point compensating fine adjustment resistor R7 is added to the pattern R4. Third Embodiment FIG. 10A is a plan view which illustrates a third embodiment of the present invention. FIG. 10B is a cross sectional view of the same. The equivalent circuit to the thin film pressure sensor according to this embodiment in the case in which the temperature compensating device (the transistor Tr) is connected from outside is similar to that according to the second embodiment shown in FIG. 9C.

According to this embodiment, since the strain gauge 3 (the patterns R1 to R4) is, as shown in FIG. 10A, in the form of a substantially elongated pattern by forming in a zigzag shape, high level resistance is displayed. Therefore, also the zero-point compensating resistor R7 displays high level resistance so as to correspond to the high resistance level setting of the strain gauge 3. The coarse zero-point compensation adjustment resistors R8 are distributed on the same circumference relative to the center of the diaphragm 1.

On the other hand, the diaphragm I is, as shown in FIG. 10B, arranged in such a manner that a holding surface 1a is formed in the axial center portion of the diaphragm 1 and a stepped portion is formed between the holding surface 1a and a pressure receiving portion 1b, and the holding portion 1a and the diaphragm pressure receiving portion 1b are positioned away from each other.

According to this embodiment thus structured, the zero-point compensating resistors can be arranged as large resistance resistors. Therefore, the necessity taken place in the second embodiment, in that the zero-point compensating coarse adjustment resistor R8 is a substantial wide pattern such as an wedge shape, can be eliminated. Therefore, its shape can be simplified and reduced, causing the manufacturing to be performed easily. Furthermore, since the coarse adjustment resistor R8 is formed on the same circle relative to the diaphragm according to this embodiment, the film thickness distribution (the largest thickness is arranged at the center of the diaphragm and is decreased toward the outside) between the divided coarse adjustment resistor R8 at the time of forming the pressure sensitive layer can be ignored. Therefore, the dispersion of the resistance levels between the divided coarse resistance adjustment resistor can be reduced. As a result, an accurate compensation can be performed.

Figure 6A:
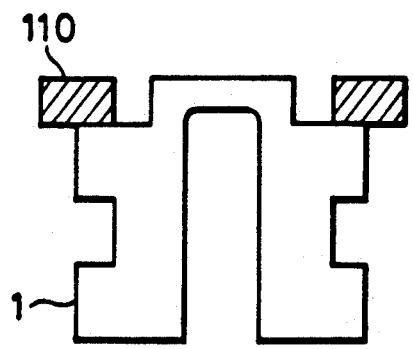
FIG. 6A illustrates the holding position of the conventional thin film pressure sensor when no pressure is applied
Figure 6B:
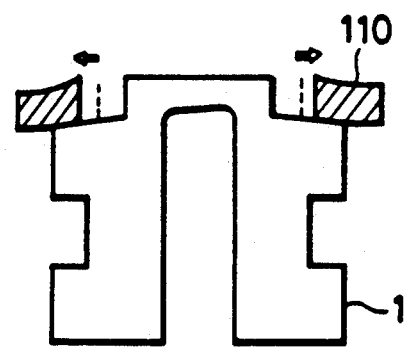
FIG. 6B illustrates the deviation in the holding position of the conventional thin film pressure sensor when pressure is applied.
Figure 11A:
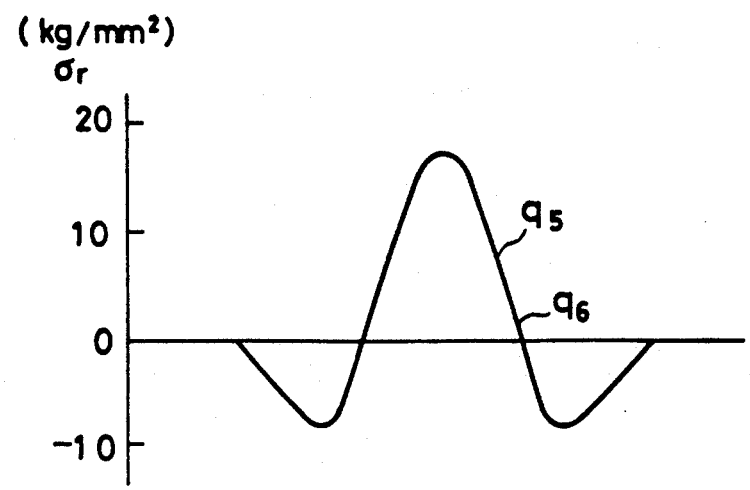
FIG. 11A illustrates the dependency of the stress distribution of the diaphragm according to the third embodiment of the present invention upon the holding position.
Figure 11B:
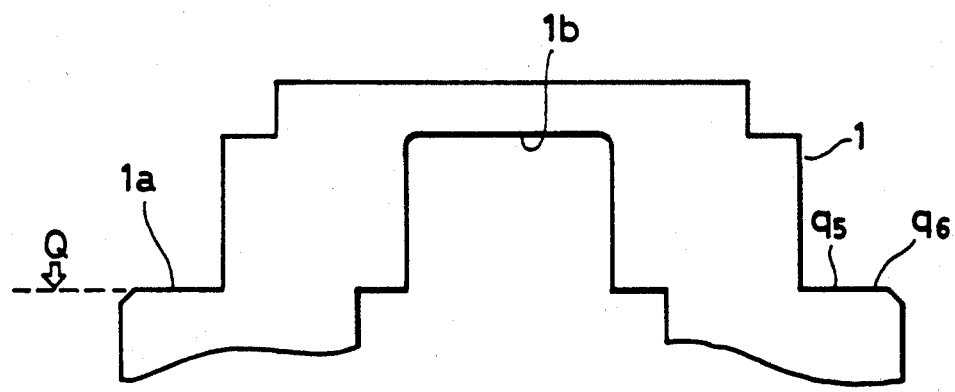
FIG. 11(B) illustrates the diaphragm of the third embodiment of the invention corresponding to FIG. 11(A)
Figure 12:
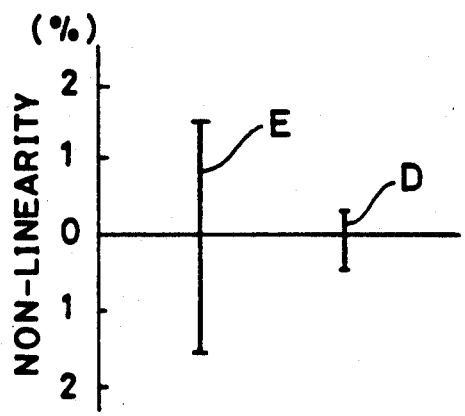
FIG. 12 illustrates the results of a comparison made upon the pressure-output characteristics between the thin film pressure sensor according to the third embodiment of the present invention and the conventional thin film pressure sensor.

According to the thin film pressure sensor according to this embodiment, since the stepped portion exists between the holding surface 1a and the pressure receiving surface 1b, even if the holding position on the holding surface 1a is deviated, an influence upon the pressure receiving surface 1b can be reduced. Therefore, the linearity of the output characteristics can be improved. As shown in FIG. 11, the distribution of stress or on the diaphragm therefore becomes as shown in the upper portion of FIG. 11 when the holding position on the holding surface 1a is q5 and q6, causing no difference taken place between them. Therefore, the pressure receiving portion of the thin film pressure sensor according to this embodiment does not receive a bad influence even if the holding position is deviated as shown in FIG. 6 at the time of applying pressure. As a result, the linearity can be significantly improved. According to this embodiment, the non-linearity of the pressure-output characteristics D is, as shown in FIG. 12, reduced to one/third with respect to the non-linearity of the conventional thin film pressure sensor E.

According to the above-described embodiments, the $SiO_2$ film 2 serving as the insulating film is directly formed on the diaphragm 1. However, a film having an intermediate level linear expansion coefficient serving as a buffer layer (for example, about 0.3 $\mu$m non-dope polycrystalline silicone film) may be laminated between the diaphragm 1 and the $SiO_2$ film 2 in order to moderate the difference of the linear expansion coefficient of the two layers.

INDUSTRIAL APPLICABILITY

As described above, the pressure sensor according to the present invention can be preferably used for measuring pressure of hydraulic machines or that in chemical processes. In particular, it is suitable to be used when pressure is measured with high sensitivity and an excellent linearity of the pressure-output characteristics desired.

What is claimed is:

1. A thin film pressure sensor module comprising a diaphragm body having an annular body segment with a thin diaphragm segment extending across one end of said annular body segment, said thin diaphragm segment having a pressure receiving side facing the interior of said annular body segment and having a reverse side opposite said pressure receiving side, a strain gauge located on said reverse side of said diaphragm segment, said annular body segment having a holding surface on the exterior thereof at a location remote form said thin diaphragm segment, said holding surface being suitable for engagement with a holding member in an assembly to mount the pressure sensor module in the assembly, the portion of said annular body segment located between said holding surface and said thin diaphragm segment having a first annular section adjacent said holding surface and remote from said thin diaphragm segment and a second annular section adjacent said thin diaphragm segment and remote form said holding surface, said second annular section having a circumference which is smaller than the circumference of said first annular section such that said first and second annular sections form a step in the exterior surface of said annular body segment such that the influence on said pressure receiving side of variations in the position of the holding member with respect to the holding surface is reduced.

2. A thin film pressure sensor module in accordance with claim 1 wherein said holding surface is formed in the axially central portion of said annular body segment.

3. A thin film pressure sensor module in accordance with claim 2 wherein said holding surface extends about the external circumference of said annular body segment.

4. A thin film pressure sensor module in accordance with claim 3 wherein said holding surface extends at least generally parallel to said thin diaphragm segment.

5. A thin film pressure sensor module in accordance with claim 4 wherein said diaphragm body is formed of metal.

6. A thin film pressure sensor module in accordance with claim 5 wherein said diaphragm body is formed of stainless steel.

7. A thin film pressure sensor module in accordance with claim 1 wherein said holding surface extends about the external circumference of said annular body segment.

8. A thin film pressure sensor module in accordance with claim 1 wherein said holding surface extends at least generally parallel to said thin diaphragm segment.

9. A thin film pressure sensor module in accordance with claim 1 wherein said diaphragm body is formed of metal.

10. A thin film pressure sensor module in accordance with claim 1 wherein said diaphragm body is formed of stainless steel.

11. A thin film pressure sensor module in accordance with claim 1 wherein said pressure receiving side of said thin diaphragm segment and said holding surface are positioned in said diaphragm body so that the stress distribution in the diaphragm segment is not significantly changed due to a shift in the position of the holding member with respect to said holding surface due to pressure applied to said pressure receiving side of said thin diaphragm segment.

12. A thin film pressure sensor module in accordance with claim 1 wherein an insulating film is positioned on said reverse side of said thin diaphragm segment between said thin diaphragm segment and said strain gauge.

13. A thin film pressure sensor module in accordance with claim 12 further comprising a resistor circuit disposed on the side of said insulating film remote from said thin diaphragm segment, said resistor circuit being formed of the same material as said strain gauge.

14. A thin film pressure sensor module in accordance with claim 13 wherein said resistor circuit comprises a plurality of resistors which are disposed on substantially the same circle with respect to the center of said thin diaphragm segment.

15. A thin film pressure sensor module comprising a diaphragm segment, said thin diaphragm segment having a pressure receiving side and a reverse side opposite said pressure receiving side, a strain gauge located on said reverse side of said diaphragm segment, said body segment having a holding surface on the exterior thereof at a location remote from said thin diaphragm segment, said holding surface being suitable for engagement with a holding member in an assembly to mount the pressure sensor module in the assembly, a portion of said body segment located between said holding surface and said thin diaphragm segment having a first section and a second section, said second section being located between said thin diaphragm segment and said first section, said first section being located between said second section and said holding surface, said second section having a smaller dimension than the corresponding dimension of said first section such that said first and second sections form a step in the exterior surface of said body segment such that the influence on said pressure receiving side of variations in the position of the holding member with respect to the holding surface is reduced.

16. A pressure sensor module in accordance with claim 15, wherein the holding surface of said body segment and said thin diaphragm segment are formed out of a block.

17. A pressure sensor module in accordance with claim 15, wherein said body segment is an annular body segment, wherein said thin diaphragm segment extends across one end of said annular body segment, and wherein each of said first and second sections is an annular section.

18. A pressure sensor module in accordance with claim 17, wherein the holding surface of said body segment and said thin diaphragm segment are formed out of a block.

19. A pressure sensor module in accordance with claim 15, wherein said strain gauge comprises a semiconductor thin film.

20. A pressure sensor module in accordance with claim 19, wherein said diaphragm body is formed of metal, and wherein said semiconductor thin film is separated form said diaphragm body by an insulating film.

* * * * *

UNITED STATES PATENT AND TRADEMARK OFFICE
CERTIFICATE OF CORRECTION

PATENT NO. : 5,191,798
DATED : March 9, 1993
INVENTOR(S) : Aki TABATA et al It is certified that error appears in the above-identified patent and that said Letters Patent is hereby corrected as shown below:

Column 10, line 11, change "form" to -- from--.

Column 10, line 46, change "form" to --from--.

Column 11, line 42, change "diaphragm segment," to --diaphragm body having a body segment supporting a thin diaphragm segment,-- .

Signed and Sealed this

Twenty-sixth Day of April, 1994

*Attest:*

BRUCE LEHMAN

*Attesting Officer*     *Commissioner of Patents and Trademarks*